Figure 1:
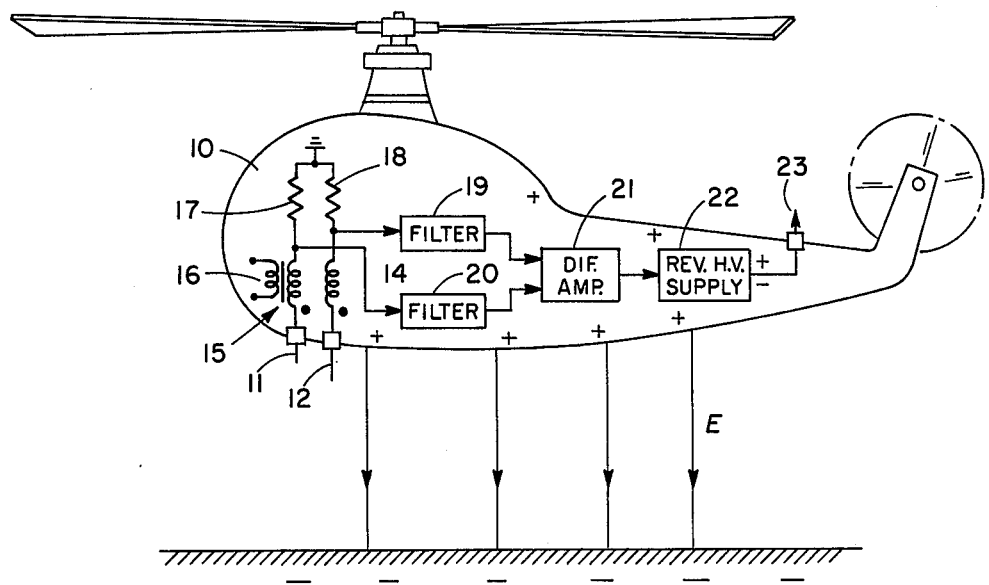

United States Patent [19]

Parkinson

[11] 4,005,357
[45] Jan. 25, 1977

[54] ELECTROSTATIC FIELD SENSOR
[75] Inventor: Gerald W. Parkinson, Stratford, Conn.
[73] Assignee: The United States of America as represented by the Secretary of the Navy, Washington, D.C.
[22] Filed: Feb. 13, 1976
[21] Appl. No.: 658,146
[52] U.S. Cl. .................................. 324/32; 324/72; 317/2 E; 244/1 A; 340/27 R
[51] Int. Cl.[2] ...................... G01R 5/28; H05F 3/06
[58] Field of Search ............... 324/32, 72; 317/2 E; 244/1 A, 17.11, 17.13; 340/27

[56] References Cited
UNITED STATES PATENTS

| | | | |
|---|---|---|---|
| 3,260,893 | 7/1966 | De La Cierva et al. | 317/2 |
| 3,427,504 | 2/1969 | De La Cierva et al. | 317/2 |
| 3,857,066 | 12/1974 | Cline et al. | 317/2 R |
| 3,866,859 | 2/1975 | Hill | 324/32 X |
| 3,874,616 | 4/1975 | Buser et al. | 244/17.11 |

Primary Examiner—R. V. Rolinec
Assistant Examiner—Vincent J. Sunderdick
Attorney, Agent, or Firm—R. S. Sciascia; L. I. Shrago

[57] ABSTRACT

An electrostatic discharge system for neutralizing the charge accumulated on an aircraft utilizes a pair of unequal length probes to sense the intensity of the external electric field. A transformer arrangement energizes these probes with out-of-phase voltages such that the corona currents flow in opposite directions through these probes. The dual probe configuration eliminates any errors due to environmental changes, while the out-of-phase excitation mode allows the AC component of the output signal to be canceled at a load resistor in the sensor circuit by a subtractive process, a feature which greatly simplifies the filtering operation.

6 Claims, 2 Drawing Figures

ELECTROSTATIC FIELD SENSOR

The present invention relates generally to apparatus for sensing electrostatic fields and, more particularly, to a dual probe arrangement for sensing the strength of an electrostatic field existing between an aircraft and the ground.

Electrostatic discharge systems are available in the prior art for neutralizing any accumulated charge acquired by a helicopter so as to minimize the hazards of electrical shock to personnel who may come in contact with an ungrounded aircraft. These discharge systems utilize probes to sense the electrostatic field between the aircraft and ground and to control associated high voltage discharge power supplies which discharge the electrostatic build-up on the aircraft.

One type of electrostatic field sensor in use consists of a fixed corona probe that is energized with a sine wave voltage of a few kilovolts amplitude. When exposed to an electrical field of a particular sign, the corona current through the probe increases during that half cycle of the applied voltage during which it has the same sign as the external field and correspondingly decreases during the other half cycle thereof. Thus, the average direct current provides a measure of the magnitude of the external electrostatic field.

The single probe configuration, however, does not possess a high degree of accuracy since its performance is influenced by environmental factors such as wind velocity, altitude, temperature and humidity. Additionally, variations in the supply voltage energizing the probe or changes in its waveform cause further deterioration in the accuracy of the field measurement. Also, the problem of extracting the DC signal component involves filtering and amplification, and both of these signal processing operations are difficult because of the adverse signal-to-noise ratio caused by the high level of the energizing voltage.

In order to avoid the errors associated with environmental changes, a discharge system has been devised which employs a pair of corona probes of equal length. Since both probes are similarly influenced by changes in the environment, these otherwise disturbing effects are canceled out by taking the difference in the DC components developed by these probes. However, the two probe system requires separate positive and negative high voltage sensor power supplies. Besides being costly and difficult to calibrate, such a system does not avoid the errors introduced by any imbalance or drift between these power supplies.

It is, accordingly, an object of the present invention to provide a dual probe electrostatic field sensing arrangement which gives an extremely accurate indication of the intensity of any electrostatic field which may exist between an aircraft and ground.

Another object of the present invention is to provide a dual probe electrostatic field sensing system which is accurate at comparatively low intensity levels and under changing environmental conditions.

Another object of the present invention is to provide a dual probe electrostatic field sensing system which has a self-canceling noise feature.

Another object of the present invention is to provide a dual probe electrostatic field sensing arrangement for use in an aircraft electrostatic discharge system which does not require either a differential amplifier or complex filtering for noise reduction.

Figure 2:
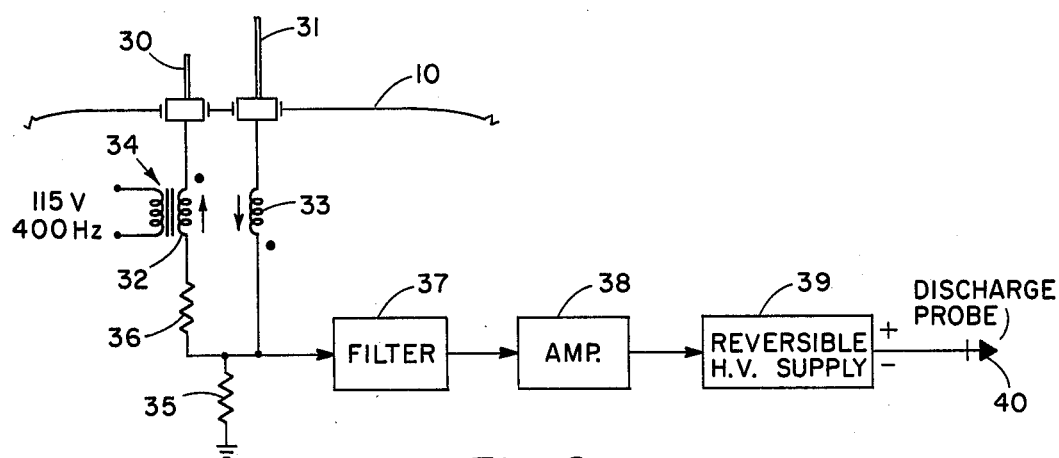

Other objects, advantages and novel features of the invention will become apparent from the following detailed description of the invention when considered in conjunction with the accompanying drawings wherein:

FIG. 1 illustrates the dual probe sensing apparatus of the present invention associated with a static discharge system for a helicopter; and FIG. 2 is an alternative arrangement in which the signal processing is simplified.

Briefly, and in somewhat general terms, the above objects of invention are accomplished by interconnecting the two sensing probes to similar secondary winding of a driving transformer which serves as the energizing means for the sensors. In one modification, the polarities of the secondary windings are such that the currents through these probes flow in the same direction. The DC components are separately filtered and then combined in a differential amplifier to produce the DC control signal for the reversible discharge power supply. In an alternative modification, the polarities of the secondary windings are such that the currents flow in opposite directions through the probes. Here, the basic AC component of the output signal is canceled by a subtractive process which occurs at the load resistor in the sensor circuit. Because of this cancellation feature, the AC noise that must be removed by the filtering operation is greatly reduced. Also, a single-ended amplifier may be employed in the electrostatic discharge system.

Referring now to FIG. 1 of the drawings which illustrates the dual probe sensing arrangement of the present invention associated with an electrostatic discharge system for a helicopter 10, a pair of stationary electrostatic sensor probes 11 and 12 of unequal length and insulated from the main body of this aircraft, extend outwardly therefrom so as to interact with any external electrical field which may be present as a result of, for example, electrostatic charge build-up on the exterior of the helicopter. The inboard ends of probes 11 and 12 are connected to corresponding sides of similar secondary windings 13 and 14 of transformer 15. The primary winding 16 of this transformer is energized by a suitable AC voltage supply of 400 Hz, not shown. The other sides of secondaries 13 and 14 are connected to ground through equal resistors 17 and 18, respectively.

Secondaries 13 and 14 are arranged such that the voltages appearing across their windings are in phase. This condition is represented by the dots adjacent the lower ends of these windings. Consequently, whenever the driving voltage exceeds the corona threshold potential of the probes, corona currents flow in both probes in the same direction. These corona currents are equal if the external electric field is zero. During one half cycle of the driving voltage, the external electrostatic field will add thereto and, consequently, the corona currents then present will be greater than those developed during the complementary half cycle when this field is in opposition to the applied voltage. The probes 11 and 12 are of unequal length and, therefore, respond to a differing extent to the influence of the external electric field. Hence, the net or average current flow through the probes will develop DC voltages across resistors 17 and 18 whose difference will be a measure of the magnitude of the external field.

By using two probes, 11 and 12, and by energizing these probes from a single power source, the adverse effects of environmental changes on the operation of the system are minimized. In this regard, when the positive corona current increases, a situation, which occurs, for example, when wind flows past the probes, each probe sees this change and responds in a similar manner. Consequently, equal error signal components appear in the output signals developed across resistors 18 and 19. Each output signal is fed to a filter, 19 and 20, which functions to remove the comparatively large AC signal component, the noise signal, caused by the high excitation signal level at primary winding 16 of transformer 15. The outputs from these filters are fed to a differential amplifier 21, wherein the error signal component is canceled. The desired DC signal, whose magnitude and polarity indicate the intensity and sign of the external electrostatic field, appears in the output of this amplifier, and this signal controls a suitable reversible high voltage DC power supply 22 that drives discharge probe 23 projecting from the helicopter. In this way, the charge is driven off the helicopter so that the voltage on the aircraft is reduced to zero or a level low enough not to be injurious to personnel who may come in contact with the helicopter.

FIG. 2 shows an alternative embodiment of the invention wherein the secondary windings 32 and 33 of transformer 34 are arranged such that the voltages applied to sensing probes 30 and 31 are out-of-phase. Thus, at any one time the voltage driving one probe will reinforce the external field while that driving the other probe will oppose this same field. Consequently, unequal positive and negative corona currents will flow in these probes when an external field is present. The difference between the magnitudes of these currents will again be proportional to the electric field between the helicopter and the ground.

Secondary winding 33 is connected to ground through load resistor 35, and secondary winding 32 is connected to ground through this load resistor and series resistor 36.

Resistor 36 is associated with the shorter probe 30 of the pair in order to equalize the resistances in the two probe circuits. Since the probes are resistive in nature, the longer probe 31 normally tends to have a higher resistance than the shorter probe 30. Thus, without this compensation, the corona currents would not, for example, be equal when the external electric field was zero, and a constant error would be present in the system. If the probe resistances are made equal then resistor 36 may be omitted.

The main advantages of the sensor circuit of FIG. 2 over that shown in FIG. 1 is the improved signal-to-noise ratio obtained by the noise cancellation feature. Since the corona currents flow in opposite directions through the probes, the comparatively high AC signal components thereof due to the excitation signal experience self-cancellation in load resistor 35. As a result of this, the output signal appearing across this resistor corresponds to the difference component between the positive and negative corona currents. A component of this signal, as mentioned hereinbefore, is the desired signal, and its magnitude is proportional to the external electric field intensity. From a different point of view, the basic AC component of the corona current merely circulates around the loop formed by the two transformer secondary windings 32 and 33, the two probes 30 and 31, series resistor 36 and the air between the probes and never reaches the load resistor.

The anti-phase relationship of the two secondary windings, therefore, greatly reduces the remnant AC noise that must be removed by the filter portion of the electrostatic discharge system. This filter is represented by circuit 37 in FIG. 2, and the output thereof is subjected to amplification in 38 before being coupled to the reversible high voltage DC power supply 39 which energizes discharge probe 40. Besides simplifying the filtering operation, the arrangement of FIG. 2 also, of course, obviates the need for a differential amplifier such as 21 in FIG. 1 and, therefore, allows a single-ended amplifier to be used in the electrostatic discharge system.

The response time of the sensors in the electrostatic discharge system must be minimized in order to permit a stable closed loop operation with acceptable errors. For an adequate system performance, a minimum bandwidth of 40 Hz is required. In one proposed modification, the exciting frequency was 400 Hz and, consequently, only one decade, 40 HZ to 400 Hz, was available between the required bandwidth and the fundamental noise frequency. Thus, the filtering operation was extremely difficult without the self-cancellation noise feature attainable with the sensing arrangement of FIG. 2.

Environmental changes, as indicated previously, effect both probes equally but changes in the electric field do not because of their unequal lengths. In this regard, an increase in the electrical field intensity produces an increase in the corona current in the larger probe that is greater than that in the shorter probe. This differential response, which is reflected in the improved characteristics of the output signal, is one of the important advantages of the two unequal length probe arrangement of the present invention as compared to the equal length configuration mentioned hereinbefore. It would be pointed out, however, that the benefits of the out-of-phase excitation mode identified above can also be realized but to a lesser extent with two probes of equal length.

It would be pointed out that improved performance may be realized by increasing the frequency of the power supply driving the probes. Also, the driving transformer 34 need not have separate secondary windings but may consists of a single winding with a suitable tapping point.

What is claimed is:

1. A probe arrangement for determining the magnitude and polarity of the electrostatic charge accumulated on an aircraft, comprising in combination
   a pair of unequal length probes insulated from said aircraft and projecting different distances therefrom into the surrounding atmosphere so as to sense the electric field present thereat;
   means for energizing said probes with equal and out-of-phase A.C. Voltages,
      said voltages being of a sufficient magnitude so as to result in corona currents flowing through said probes in opposite directions when said electric field has zero intensity; and
   means for combining said corona currents so as to develop a signal whose amplitude indicates the magnitude of the electrostatic charge accumulated on said aircraft and whose sign indicates the polarity of this accumulated charge.

2. A probe arrangement for use in a system for discharging an electrostatic charge accumulated on a body, comprising in combination a pair of probes of unequal length and resistance insulated from said body and projecting into the surrounding atmosphere so as to interact with the external electric field;

means for exciting said probed with out-of-phase A.C. voltages such that when the external electric field has zero intensity, equal corona currents flow in said probes in opposite directions; and means for combining said corona currents so as to develop a signal whose amplitude indicates the magnitude of the electrostatic charge accumulated on said body and whose sign corresponds to the polarity of this accumulated charge.

3. A probe arrangement for use in an aircraft electrostatic discharge system, comprising in combination
a pair of unequal length probes insulated from said aircraft and extending into the surrounding atmosphere different distances so as to interact with the external electric field present thereat;

means for exciting said probes with equal AC voltages that have an out-of-phase relationship,
said voltages being of sufficient magnitude so as to result in corona currents flowing through said probes,
said corona currents being in opposite directions because of the out-of-phase excitation of said probes; and means for processing said corona currents so as to develop an output signal having a magnitude equal to the difference in amplitudes of said corona currents and having a sign corresponding to the polarity of the accumulated charge on said aircraft.

4. In an arrangement as defined in claim 3 wherein said means for exciting said probes and processing said corona currents includes
a transformer having a pair of similar secondary windings;
a compensating resistance;
a load resistance;
one secondary of said transformer, said compensating resistance and said load resistance being connected in series between the shorter probe of said pair and a reference potential,
the other secondary of said transformer and said load resistor being connected in series between the longer probe of said pair and said reference potential,
said output signal appearing across said load resistance when the primary winding of said transformer is energized.

5. In an arrangement as defined in claim 4 wherein the longer probe of said pair has a higher resistance than the shorter probe of said pair and wherein said compensating resistance has value equal to the difference in the resistance of said probes.

6. In an arrangement as defined in claim 5
means for filtering said output signal so as to remove therefrom any noise component introduced by the supply source energizing the primary winding of said transformer.

* * * * *